(12) United States Patent
Boehm et al.

(10) Patent No.: US 9,780,745 B2
(45) Date of Patent: Oct. 3, 2017

(54) METHOD AND APPARATUS FOR USE IN SIGNAL PROCESSING

(71) Applicant: Infineon Technologies AG, Neubiberg (DE)

(72) Inventors: Christoph Boehm, Graz (AT); Maximilian Hofer, Hartberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/013,406

(22) Filed: Feb. 2, 2016

(65) Prior Publication Data
US 2016/0226452 A1     Aug. 4, 2016

(30) Foreign Application Priority Data
Feb. 2, 2015   (DE) .......................... 10 2015 101 483

(51) Int. Cl.
*H03F 1/02* (2006.01)
*H03F 3/68* (2006.01)
*H03F 3/45* (2006.01)

(52) U.S. Cl.
CPC ..... *H03F 3/45977* (2013.01); *H03F 3/45475* (2013.01); *H03F 2203/45048* (2013.01); *H03F 2203/45116* (2013.01); *H03F 2203/45138* (2013.01); *H03F 2203/45154* (2013.01)

(58) Field of Classification Search
CPC ................. H03F 1/02; H03F 1/34; H03F 3/68
USPC ............................. 330/2, 9, 84, 86
See application file for complete search history.

(56) References Cited

U.S. PATENT DOCUMENTS

| | | | |
|---|---|---|---|
| 5,510,751 A * | 4/1996 | Nauta | H04B 3/02 330/260 |
| 5,594,385 A | 1/1997 | Anvari | |
| 7,265,611 B2 * | 9/2007 | Wang | H03F 3/45753 327/124 |

FOREIGN PATENT DOCUMENTS

WO     WO-01/91288 A1     11/2001

OTHER PUBLICATIONS

Office Action dated Jan. 20, 2016 for German patent Application No. 102015101483.1.

* cited by examiner

*Primary Examiner* — Steven J Mottola
(74) *Attorney, Agent, or Firm* — Schiff Hardin LLP

(57) ABSTRACT

Disclosed herein are a method, circuitry and an integrated circuit chip for use in signal processing. The integrated circuit chip comprises an operational amplifier, a reference amplifier, and a control unit. The control unit is coupled to the reference amplifier and to the operational amplifier. The control unit is configured to control the reference amplifier based on a signal received from the reference amplifier.

18 Claims, 5 Drawing Sheets

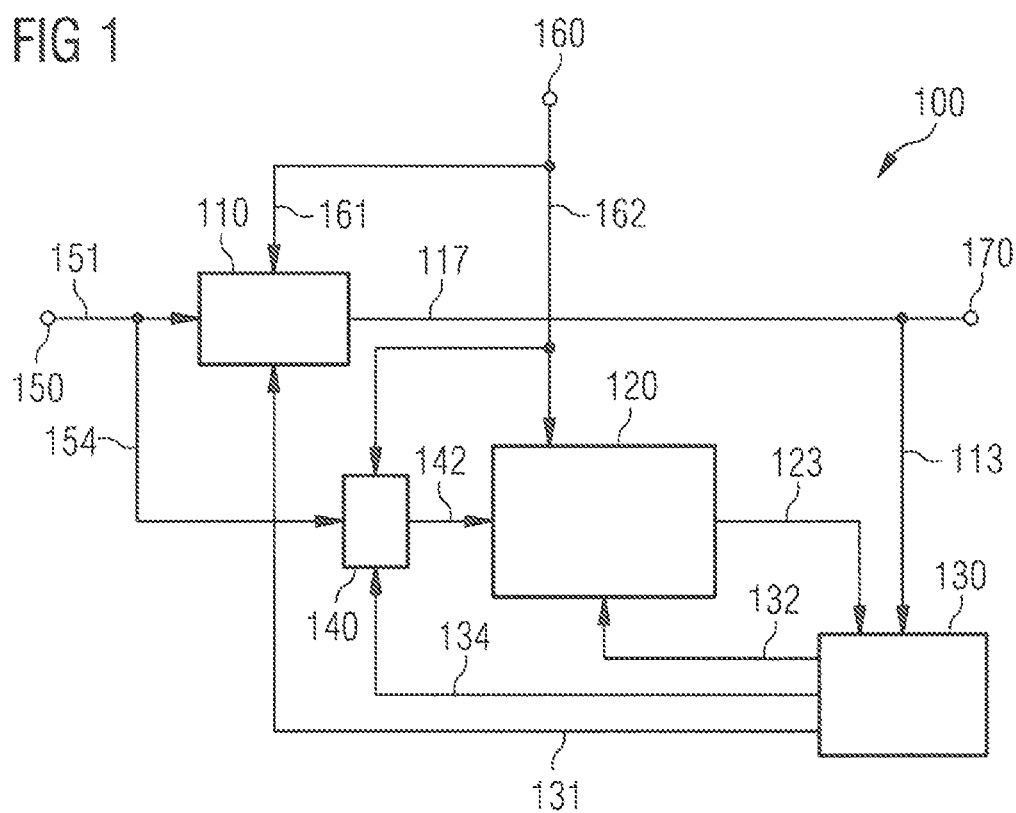

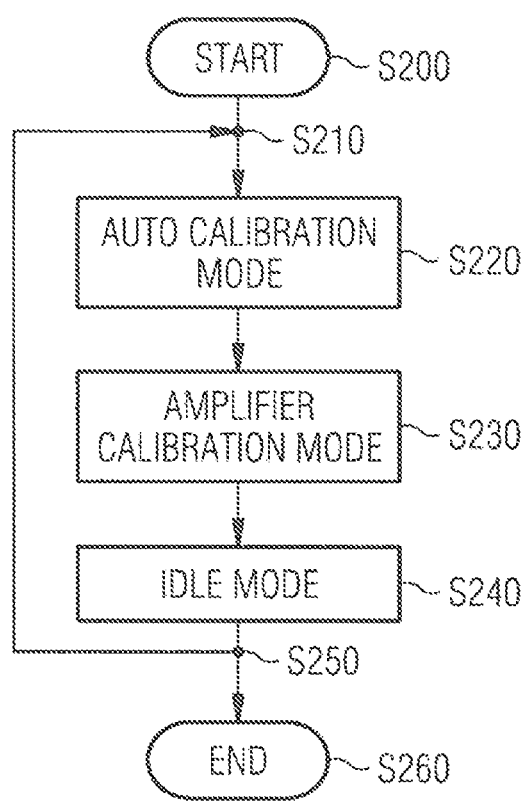

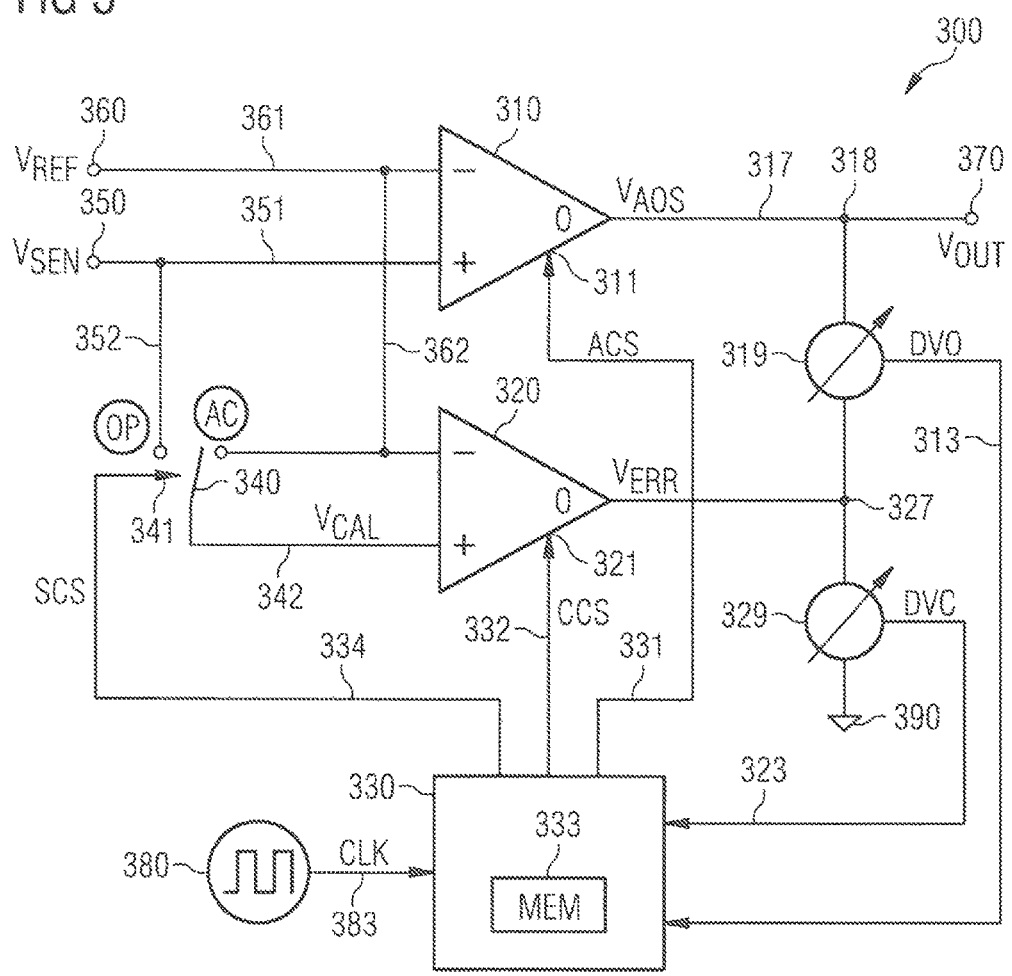

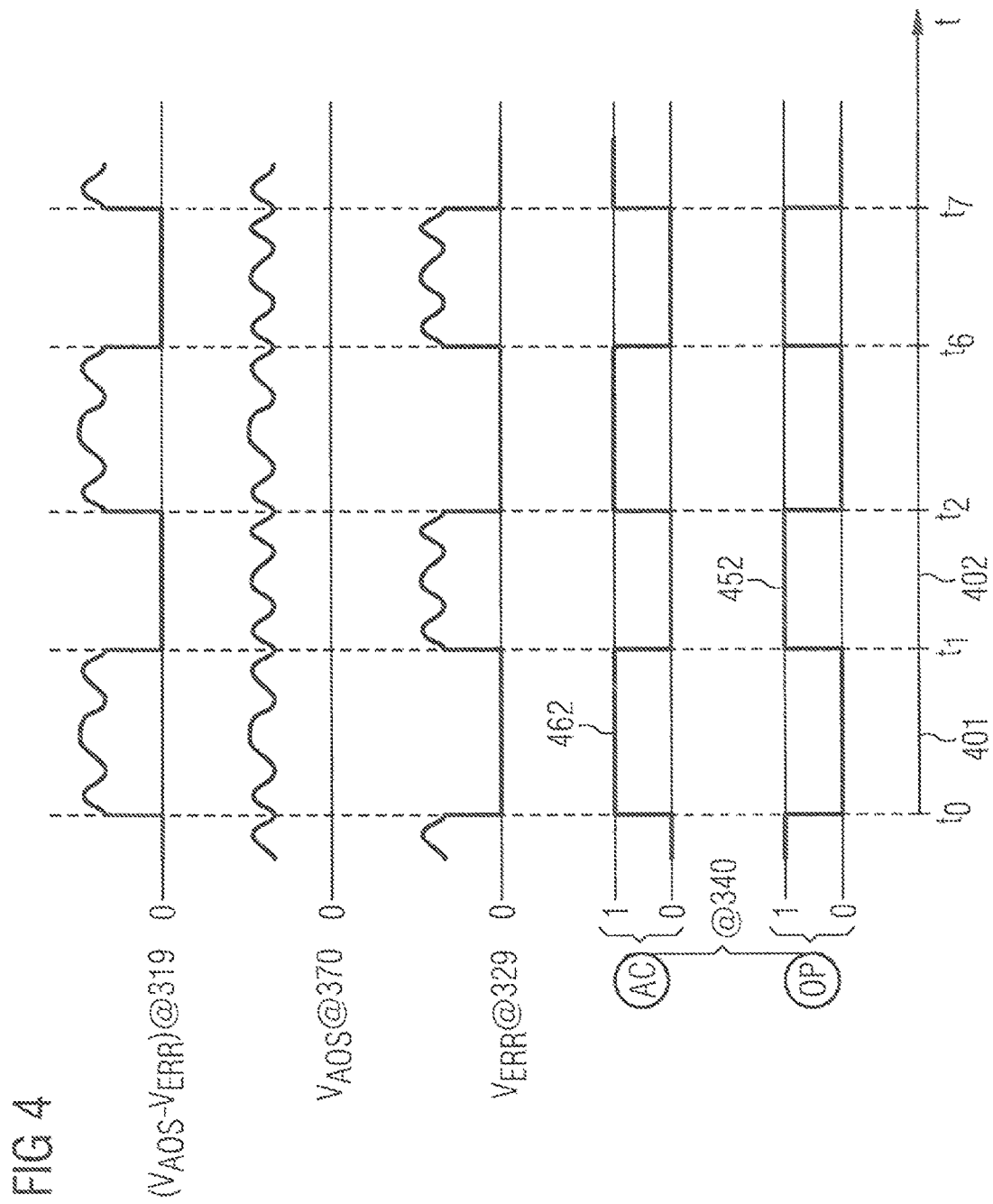

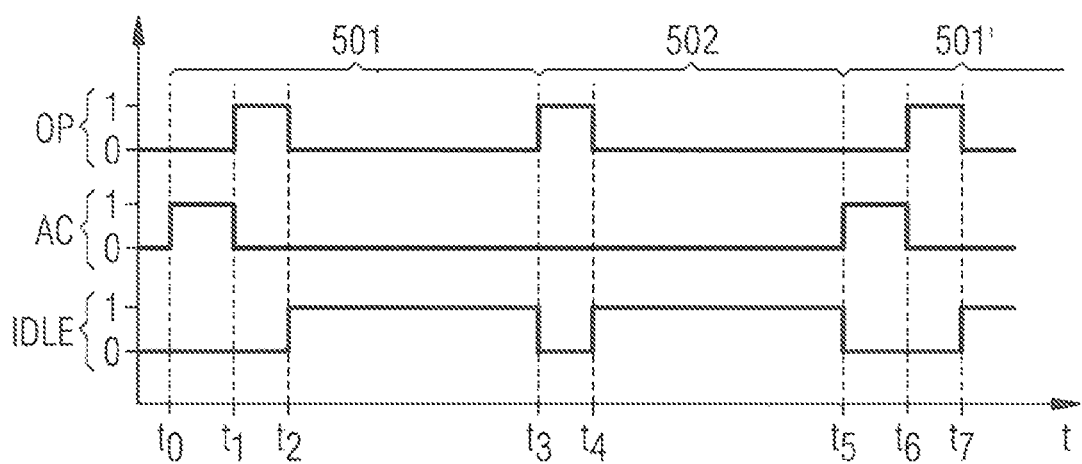

ic effects. Environmental effects can vary with time. For example, the operational amplifier can warm up depending on exposure to coolant and properties of that coolant. The change in operating temperature can bring about a change of an operating point of the operational amplifier that, as a result, is offset with respect to a fixed design operating point.

In order to ensure operation of the operational amplifier according to design, the operational amplifier is biased, i.e., the amplified voltage signal is based on a superposition of the sensed voltage signal and an essentially constant bias voltage.

A difficulty is to get the bias voltage to adequately compensate effects that offset the operating point of the operational amplifier. Further, it is difficult to take account of varying environmental effects on the operation of the operational amplifier, without disrupting that operation to allow for a fresh calibration to update the bias voltage.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention.

FIG. 1 is a block diagram schematically illustrating an amplifier system according to some embodiments.

FIG. 2 is a flowchart that illustrates a method according to some embodiments implemented in the amplifier system of FIG. 1.

FIG. 3 is a block diagram illustrating an exemplary amplifier arrangement 300 implementing the amplifier system of FIG. 1 using various electronic components in accordance with some embodiments.

FIG. 4 is a timing diagram illustrating modes of operation of the amplifier system in FIG. 3 according to some implementations.

FIG. 5 is a timing diagram illustrating modes of operation of the amplifier system in FIG. 1 according to some implementations.

The elements of the drawings are not necessarily to scale relative to each other. Like reference numerals designate corresponding similar parts. Because components of embodiments according to the present invention can be positioned in a number of different orientations, directional terminology may be used for purposes of illustration that, however, is in no way limiting, unless expressly stated to the contrary. Other embodiments according to the present invention and many of the intended advantages of the present invention will be readily appreciated as they become better understood by reference to the following detailed description. It is to be understood that other embodiments may be utilized and structural or logical changes may be made without departing from the scope of the present invention. The following detailed description, therefore, is not to be taken in a limiting sense, and the scope of the present invention is defined by the appended claims.

DETAILED DESCRIPTION

Below, embodiments, implementations and associated effects are disclosed with reference to the accompanying drawings.

FIG. 1 is a block diagram schematically illustrating an amplifier system according to some embodiments. Amplifier system 100 comprises an operational amplifier block 110. Further, amplifier system 100 comprises a calibration block 120 that is coupled to operational amplifier block 110. Still further, amplifier system 100 comprises a control block 130 that is coupled to operational amplifier block 110 and calibration block 120. Amplifier system 100 comprises a switch block 140 that is coupled between control block 130 and calibration block 120. Amplifier system 100 also includes an amplifier system signal input port 150, a reference signal port 160, and an amplifier system signal output port 170. In some embodiments amplifier system 100 includes other ports such as power supply (in FIG. 1 not shown) and/or ground (in FIG. 1 not shown).

Amplifier block 110 is coupled, via an amplifier reference signal path 161, to reference signal port 160. Amplifier block 110 is coupled, via in-signal path 151, to amplifier system signal input port 150. Amplifier block 110 is coupled via an out-signal path 117 to amplifier system signal output port 170. Amplifier block 110 is configured to receive an in-signal from amplifier system signal input port 150, to amplify the received in-signal, and to output a corresponding amplifier out-signal to amplifier system signal output port 170.

Calibration block 120 has a calibration reference terminal (not shown) that is coupled, via a calibration reference signal path 162, to reference signal port 160. Calibration block 120 is coupled via an activatable/deactivatable in-signal path 154, to amplifier system signal input port 150. Calibration block 120 is coupled, via an error signal path 123, to control block 130. Calibration block 120 is configured to output, on error signal path 123, a calibration error signal. Calibration block 120 is configured to cooperate with control block 130 so as to calibrate, in some embodiments continuously, amplifier block 110. Calibration block 120 is configured to cooperate with control block 130 so as to calibrate, depending on a setting provided at switch block 140, calibration block 120. It should be noted that in some implementations, as in the embodiment shown in FIG. 1, the reference voltage at reference signal port 160 is the used for both, amplifier block 110 and calibration block 120. In some implementations, however, the amplifier reference terminal and the calibration reference terminal are kept separate and configured to be set to different voltage levels.

Control block 130 is coupled via an out-signal path 113 to amplifier block 110 and/or via the error signal path 123 to calibration block 120. Control block 130 is coupled via an amplifier control signal path 131 to amplifier block 110, via a calibration control signal path 132 to calibration block 120, and via switch control signal path 134 to switch block 140. Further, control block 130 is configured to receive, from calibration block 120, the calibration error signal. In some embodiments control block 130 is configured to derive a difference signal reflective of a difference between the amplifier out-signal and the calibration error signal.

Since a difference signal that represents a lack of calibration is an analog signal, an analog-to-digital block (not shown) can be coupled between amplifier block 110 and control block 130 (for example forming part of out-signal path 113) and/or between calibration block 120 (for example forming part of error signal path 123) and control block 130. In some implementations the analog-to-digital block forms part of control block 130. The analog-to-digital block is configured to receive, at least one of amplifier out-signal and calibration error signal, and provide a digital representation of the received (analog) signal. In some embodiments the digital representation is 1 bit, i.e., the analog-to-digital converter is configured to assign an analog signal value to either zero or one of the digital signal, depending on a predetermined voltage level in the received analog signal being exceeded or not. For example, the analog-to-digital converter can be implemented using at least one inverter that associates an entry voltage level with either zero or one output from the inverter. At least one effect is that sequences of bit can be stored by control block 130 as setting value(s) for delayed use, for example, after a shut-down of amplifier system 100, at a subsequent initialization of amplifier system 100.

Control block 130 is configured to derive, based on the amplifier out-signal from amplifier block 110 and on the calibration error signal from calibration block 120, an amplifier control signal to be provided to amplifier block 110 via an amplifier control signal coupling 131 for use in control, in particular for calibration, of amplifier block 110. In some embodiments control block 130 is configured to use a difference between the amplifier out-signal from amplifier block 110 and the calibration error signal from calibration block 120 for deriving the amplifier control signal. In some embodiments, calibration block 120 resembles amplifier block 110, at least in terms of characteristic electrical behaviour, to such an extent that both, amplifier block 110 and calibration block 120 operate essentially the same. For example, in some embodiments where amplifier block 110 is provided as an operational amplifier of a certain circuit structure, calibration block 120 can be provided as a calibration amplifier having an essentially same circuit structure as the operational amplifier. In another example, a plurality of calibration amplifiers can constitute calibration block 120, wherein the calibration amplifiers are structure such that a characteristic of calibration block 120 results that is similar to a characteristic of amplifier block 110. Therefore, the difference between the amplifier out-signal from amplifier block 110 and the calibration error signal from calibration block 120 should disappear in operation of amplifier system 100 and the amplifier control signal should be indicative of proper setting of amplifier block 110 and/or of there currently not being any need to adjust any setting of amplifier block 110.

In some embodiments control block 130 is configured to derive, based on the calibration error signal from calibration block 120, a calibration control signal for use in calibrating calibration block 120 to be provided, via a calibration control signal coupling 132, to calibration block 120. Deriving the calibration control signal requires calibration block 120 to feed a same signal, for example a reference voltage signal obtained from reference signal port 160, to both, the reference terminal and a sense terminal of calibration block 120 such that, in a calibrated state, a level of the out-signal from calibration block should reflect identical signal levels at the reference terminal and at the sense terminal of calibration block 120.

Control block 130 is further configured to derive a switch control signal to be provided, via a switch control signal coupling 134, to switch block 140 for use in control of switch block 140 to switch between calibration of amplifier block 110 and calibration of calibration block 120.

Thus, control block 130 is configured to output the amplifier control signal to amplifier control signal coupling 131, the calibration control signal to calibration control signal coupling 132, and the switch control signal to switch control signal coupling 134.

In some embodiments control block 130 is coupled to a memory configured to store digital representations of setting values and/or of other values suitable for use in resetting amplifier block 110 and/or calibration block 120 such that amplifier block 110 and/or calibration block 120 are reset to operate calibrated and/or auto-calibrated, respectively.

Switch block 140 is configured to either activate or deactivate in-signal path 154, depending on the switch control signal received from control block 130. In some implementations, if in-signal path 154 is active, then switch block 140 is configured to output the in-signal to calibration block 120. If in-signal path 154 is deactivated, then switch block 140 is configured to output the reference signal as an auto reference signal to calibration block 120.

In some embodiments reference signal port 160 is configured to be set to a constant reference voltage level. However, some implementations do not associate reference signal port 160 with a constant voltage level, but allow the voltage level at reference signal port 160 to be variable. It should be understood that amplifier system 100 is not limited to having a single reference voltage but, in some embodiments, includes another reference voltage terminals (not shown) that is configured to be set, for example, to a constant reference voltage.

Operation of amplifier system 100 according to some implementations will now briefly be described with reference to FIG. 2 and FIG. 5, wherein FIG. 2 illustrates a flowchart that illustrates a method according to some embodiments that are implemented in the amplifier system of FIG. 1 while FIG. 5 is a timing diagram illustrating modes of operation of the amplifier system in FIG. 1 according to some implementations.

At S200, corresponding to a point in time prior to t0, operation of amplifier system 100 is started. In some implementations, where the coupled memory stores digital representations of setting values and/or of other values suitable for use in resetting amplifier block 110 and/or calibration block 120, control block 130 reads such values from the coupled memory for use, for example, to reset amplifier block 110 and/or calibration block 120 to operate calibrated and/or auto-calibrated, respectively.

Passing a point in time, still prior to t0, at S210, switch block 140 deactivates in-signal path 154. Now, at time t0, switch block 140 outputs the auto reference signal to calibration block 120. Thus, at S220, at time t0, amplifier system 100 enters an auto calibration mode (AC). In auto calibration mode (AC), calibration block 120 outputs an auto calibration error signal to control block 130. Control block 130, based on the auto calibration error signal, generates an auto calibration control signal designed for calibration block 120 to reduce the error that gave rise to the auto calibration error signal. Control block 130 outputs the auto calibration control signal to calibration control signal coupling 132 for delivery to calibration block 120. It should be understood that, at least in some implementations, other information such as configuration page data and/or control structure values, for example configuration start values, and the like, can additionally be provided to calibration block 120.

Based on timing information, at time t1, control block 130 generates a switch control signal for switch block 140 to activate in-signal path 154. Control block 130 outputs the switch control signal to switch control signal coupling 134 for delivery to switch block 140. Accordingly, switch block 140 activates in-signal path 154 and outputs the in-signal to calibration block 130. Thus, at S230, amplifier system 100 enters into an amplifier calibration mode (OP) for calibration of amplifier block 110.

Calibration block 120 outputs an amplifier calibration error signal to control block 130. Control block 130, based on a combination of the amplifier calibration error signal and an operational amplifier out-signal obtained from amplifier block 110, generates an amplifier calibration control signal designed for amplifier block 110 to reduce the error that gives rise to the amplifier calibration error signal. Control block 130 outputs the amplifier calibration control signal to amplifier control signal coupling 131 for delivery to amplifier block 110.

In some implementations, when done with amplifier calibration, control block 130 signals to switch block 140 to deactivate in-signal path 154, and switch block 140 deactivates in-signal path 154, whereby the in-signal received at amplifier system signal input port 150 is no longer provided to calibration block 120.

According to some implementations, at time t2, control block 130 generates, based on timing information, a calibration block idle signal for calibration block 120 to switch into an idle mode (IDLE). In some embodiments, calibration block 120 consumes less power than when operating in the auto calibration mode (AC) and/or in the amplifier calibration mode (OP). Thus, at S240, calibration block 120 enters into idle mode (IDLE).

At S250, control block 130 reverts, based on timing information, to S210 and at S220, if in-signal path 154 should be active at this point, again deactivates in-signal path 154, whereby amplifier system 100 enters into the amplifier calibration mode (OP). Thus, control block 130 reiterates a cycle of auto calibration mode (AC), amplifier calibration mode (OP), and idle mode (IDLE).

It should be understood that, depending on structural characteristics of amplifier system 100 as well as operational circumstances, in some implementations the sequence of modes entered into between S210 and S250 does not in every cycle encompass all of auto calibration mode (AC), amplifier calibration mode (OP), and idle mode (IDLE). For example, in some embodiments a first cycle 501 encompasses auto calibration mode (AC), amplifier calibration mode (OP) and idle mode (IDLE). However, assuming that calibration block 120, having undergone auto calibration during the auto calibration mode of the first cycle 501, continues to be sufficiently calibrated, there is no need for auto calibration during a second cycle 502. Therefore, like in the example illustrated in FIG. 5, the second cycle 502 merely encompasses, beginning at time t3, the amplifier calibration mode (OP), and, beginning at time t4, the idle mode (IDLE).

Eventually, at S250, if the operation is decided to be terminated, in some embodiments the method moves on to S260, where the operation of amplifier system 100 ends (no corresponding point in time is shown in FIG. 5).

In some implementations where control block 130 writes to the coupled memory digital representations of setting values and/or of other values suitable for use in resetting amplifier block 110 and/or calibration block 120 such that amplifier block 110 and/or calibration block 120 are reset to operate calibrated and/or auto-calibrated, respectively.

At least one effect in the above-described system can be that amplifier block 110, despite being subject to calibration, continues to sense and amplify a signal corresponding to the in-signal received at amplifier system signal input port 150 and continues to provide an accordingly amplified amplifier out-signal to amplifier system signal output port 170. Further, intervals where amplifier block 110 is not subject to calibration, i.e., intervals other than those where amplifier system 100 is in amplifier calibration mode (OP), can be used to calibrate calibration block 120 itself, i.e., provide an interval where amplifier system 100 is in auto calibration mode (AC).

An implementation of amplifier system 100 according to some embodiments will now be described in more detail with reference to FIG. 3 that is a block diagram illustrating an exemplary amplifier arrangement 300 implementing the amplifier system of FIG. 1 using various electronic and/or electrical components.

Amplifier arrangement 300 comprises an operational amplifier 310 and a calibration amplifier 320. Further, amplifier arrangement 300 comprises an in-signal port 350, a reference voltage port 360, and an out-signal output port 370. Amplifier arrangement 300 also comprises a switch 340, a control circuit 330, a clock generator 380 and ground terminal 390. Some embodiments include a supply voltage port (not shown) configured to couple some or all components of amplifier arrangement 300 to a power supply (not shown).

Operational amplifier 310 is provided as a comparator having a first input terminal (shown in FIG. 3 marked by a "−" sign, i.e., as inverting), herein also referred to as reference terminal, a second input terminal (shown in FIG. 3 marked by a "+" sign, i.e., as non-inverting), herein also referred to as sense terminal, and an output terminal (shown in FIG. 3 marked by "○"). The first input terminal (−) of operational amplifier 310 is coupled, via reference line 361, to reference voltage port 360. The second input terminal (+) of operational amplifier 310 is coupled, via in-signal line 351, to in-signal port 350. The output terminal (○) of operational amplifier 310 is coupled via out-signal line 317 to out-signal port 370. Further, the output terminal (○) of operational amplifier 310 is coupled, via an operational voltage meter 319, to ground terminal 390.

Operational amplifier 310 is configured to set the output terminal (○) to an amplifier out-signal voltage (VAOS) that is indicative of a difference between a reference signal voltage (VREF) at the first input terminal (−) and an amplifier in-signal voltage (VAIS) at the second input terminal (+). Operational amplifier 310 further has a control signal entrance 311 and is configured to apply, according to an amplifier control signal (ACS) received at control signal entrance 311, an amplifier bias voltage in the comparison of the in-signal voltage to the reference signal voltage. In some embodiments control signal entrance 311 of operational amplifier 310 is configured to be set to the amplifier bias voltage so as to establish an amplifier operating point where operational amplifier 310 is biased to operate, for example, essentially linearly and/or according to another predetermined and/or desired function.

Calibration amplifier 320 is provided as a comparator having a first input terminal (shown in FIG. 3 marked by a "−" sign, i.e., as inverting), herein also referred to as reference terminal, a second input terminal (shown in FIG. 3 marked by a "+" sign, i.e., as non-inverting), herein also referred to as calibration terminal, and an error terminal. The first input terminal (−) of calibration amplifier 320 is coupled, for example, at least via a reference line 362, to reference voltage port 360. The second input terminal (+) of calibration amplifier 320 is coupled, via calibration signal line 342 to switch 340. The error terminal of calibration amplifier 320 is coupled, via a calibration voltage meter 329, to ground terminal 390.

Calibration amplifier 320 is configured to set the error terminal to a calibration error voltage (VERR) that depends on a difference between the reference signal voltage (VREF) set at the first input terminal (−) and a calibration signal voltage (VCAL) set at the second input terminal (+). Calibration amplifier 320 further has a control signal entrance 321 and is configured to apply, according to a calibration control signal received at control signal entrance 321, a calibration bias voltage in the comparison of the calibration signal voltage to the reference signal voltage. In some embodiments control signal entrance 321 of calibration amplifier 320 is configured to be set to the calibration bias voltage so as to establish a calibration operating point where calibration amplifier 320 is calibrated to operate, for example, essentially linearly and/or according to another predetermined and/or desired function.

Operational voltage meter 319 is configured to provide, to control circuit 330, via a signal line 313, an operational voltage difference signal (DVO) indicative of a difference between the amplifier out-signal voltage VAOS that operational amplifier 310 outputs at the operational amplifier's output terminal (○) to output voltage port 370 and the error voltage (herein also referred to as out-voltage of the calibration amplifier) VERR that calibration amplifier 320 outputs from the calibration amplifier's output terminal (○) to a circuit node 327. In some embodiments this difference itself directly forms the signal provided by operational voltage meter 319 to control circuit 330.

Calibration voltage meter 329 is configured to provide, to control circuit 330, via a signal line 323, a calibration voltage difference signal (DVC) indicative of a difference between the out-voltage VERR that calibration amplifier 320 outputs from the calibration amplifier's output terminal (○) to circuit node 327 and a ground voltage at ground terminal 390. In some embodiments this difference itself directly forms the signal provided by calibration voltage meter 329 to control circuit 330.

Switch 340 is coupled, for example, at least via an in-signal line 352, to in-signal port 350, and, for example, at least via the reference line 362, to reference voltage port 360. Further, switch 340 has a control signal entrance 341 and is configured to set, according to a switch control signal (SCS) received at control signal entrance 341, switch 340 at least either to an auto calibration connection state (shown in FIG. 3 marked by "AC") or to an operational amplifier calibration connection state (shown in FIG. 3 marked by "OP"). In the auto calibration connection state (AC) switch 340 connects calibration signal line 342 to reference line 362; thus, switch 340 couples the second input terminal (+) of calibration amplifier 320 to reference voltage port 360. In the operational amplifier calibration connection state (OP) switch 340 connects calibration signal line 342 to in-signal line 352; thus switch 340 couples the second input terminal (+) of calibration amplifier 320 to in-signal port 350.

Control circuit 330 is configured to control operation of amplifier arrangement 300. Accordingly, control circuit 330 is coupled, via clock line 383, to clock generator 380 and configured to receive a clock signal (CLK) from clock generator 380. Further, control circuit 330 is coupled, via signal line 313, to operational voltage meter 319 and configured to receive the operational voltage difference signal (DVO) from operational voltage meter 319. Also, control circuit 330 is coupled, by signal line 323, to calibration voltage meter 329 and configured to receive the calibration voltage difference signal (DVC) from calibration voltage meter 329. Control circuit 330 is coupled, via control signal line 331, and configured to provide amplifier control signals ACS to control signal entrance 311 of operational amplifier 310. Further, control circuit 330 is coupled, via control signal line 332, to control signal entrance 321 of calibration amplifier 320 and configured to provide calibration control signals CCS to control signal entrance 321 of calibration amplifier 320. Also, control circuit 330 is coupled, via a control signal line 334, to a control signal entrance 341 of switch 340 and configured to provide switch control signals SCS to control signal entrance 341 of switch 340.

In some embodiments an analog-to-digital converter (not shown) is coupled between operational amplifier 310 and control circuit 330 (for example on signal line 313). The analog-to-digital converter is configured to receive the operational voltage difference signal (DVO) as an analog signal and to generate a digital representation of the received analog signal. In some embodiments the digital representation is 1 bit, i.e., the analog-to-digital converter is configured to assign an analog signal value to either zero or one of the digital signal, depending on a predetermined voltage level in the received analog signal being exceeded or not. In some embodiments, likewise, an analog-to-digital converter (not shown) is coupled between calibration amplifier 320 and control circuit 330 (for example on signal line 323). The analog-to-digital converter is configured to receive the calibration voltage difference signal (DVC) as an analog signal and to generate a digital representation of the received analog signal. For example, in particular where the associated operational amplifier has a large gain, the analog-to-digital converter essentially comprises an inverter that, in accordance with amplifier gain, discriminates fine differences in voltage level from a target zero voltage level and is thus suitable to form a basis for fine control signal for use in control of the amplifier(s). At least one effect can be that little area is needed where the described implementation is provided in an integrated circuit. In some embodiments the analog-to-digital converter is formed as an eight bit converter, wherein a bias voltage is ramped in order to establish a ramp voltage where threshold value is reached that results in change of output level from zero to one, or vice versa. The threshold value, in particular when represented, for example, by eight bit, can be used to bias the amplifier. At least one effect can be that sequences of bit can be stored by control block 130 as setting value(s) for delayed use, for example, after a shut-down of amplifier arrangement 300, at a subsequent initialization of amplifier arrangement 300.

Control circuit 330 is configured to process, clocked by the clock signal CLK, the operational voltage difference signal DVO and/or the calibration voltage difference signal DVC so as to generate control signalling SCS, CCS, ACS for use in control of switch 340, for use in control of calibration amplifier 320 and/or for use in control of operational amplifier 310. Some embodiments of control circuit 330 are configured to couple to a memory unit 333. In some embodiments memory unit 333 forms part of control circuitry 330. Control circuit 330, in some embodiments, is adapted to provide a digital representation of information for use in control signalling to memory unit 333, for example, by writing the digital representation into memory unit 333. Further, control circuit 330 is configured to read digital representations of information for use in control signalling, for example a digital representation of an amplifier bias voltage value, from memory unit 333, and, as the case may be, either extract the represented information for use in generating control signals and/or to directly communicate the information at least, as needed, to one of switch 340, calibration amplifier 320 and/or operational amplifier 310.

Operation of amplifier arrangement 300 according to some implementations will now briefly be described with reference, again, to FIG. 2 and with reference to FIG. 4. As described above, FIG. 2 illustrates a flowchart that illustrates a method according to some embodiments that are implemented in the amplifier system 100 of FIG. 1 and/or in the amplifier arrangement 300 of FIG. 3. FIG. 4 is a timing diagram illustrating modes of operation of the amplifier arrangement in FIG. 3 according to some implementations. In some embodiments and implementations described below, control circuit 330 bases advance from one method step to another on timing information. It should be understood that this timing information can be based on the clock signal CLK received at control circuit 330, via clock line 383, from clock generator 380, wherein control circuit 330 can process the clock signal CLK to determine, for example, beginning and/or end of an interval during that the described processing should be performed.

At S200, corresponding to a point in time prior to t0, operation of amplifier arrangement 300 is started. In some implementations, where memory unit 333 stores digital representations of bias voltage values and/or of other values suitable for use in setting operational amplifier 310 and/or calibration amplifier 320, control circuit 330 reads such values from memory unit 333 for use, for example, in determining an initial bias voltage for operational amplifier 310 and/or in determining an initial bias voltage for calibration amplifier 320 so as to operate calibrated and/or auto-calibrated, respectively.

The first input terminal (−) of operational amplifier 310 is set, via reference line 361, to the reference voltage VREF at reference voltage port 360. The second input terminal (+) of operational amplifier 310 senses, via in-signal line 351, the in-signal voltage VSEN at in-signal port 350. Operational amplifier 310 sets the output terminal (o) to an amplifier out-signal voltage VAOS that reflects a difference between the in-signal voltage VSEN set at the second input terminal (+) of operational amplifier 310 and the reference signal voltage VREF set at the first input terminal (−). The amplifier out-signal voltage VAOS, via out-signal line 317, is provided to out-signal port 370.

Passing a point in time, still prior to t0, at S210, while continuing the operation of operational amplifier 310 as described above, switch 340, at S220, in some embodiments deactivates in-signal coupling of the second input terminal (+) of calibration amplifier 320 and in-signal port 350; in some embodiments in-signal coupling of the second input terminal (+) of calibration amplifier 320 and in-signal port 350 was already deactivated at an earlier stage after a previous performance of auto calibration.

At S220, at time t0, switch 340 activates in-signal coupling of the second input terminal (+) of calibration amplifier 320 and reference voltage port 360 by connecting calibration signal line 342 to reference line 362. Thus, amplifier arrangement 300 enters an auto calibration mode (AC). In auto calibration mode (AC), calibration amplifier 320 sets the error terminal (o) to an auto calibration error voltage VERR that reflects a difference between the calibration signal voltage VCAL (for example in an embodiment where the coupling to reference voltage port 360 via switch 340 is provided by a direct connection: VCAL=VREF) set at the second input terminal (+) of calibration amplifier 320 and the reference signal voltage VREF set at the first input terminal (−). Since both, the first input terminal (−) and the second input terminal (+) are connected to the same reference line 362, in perfect calibration, any difference of voltages VCAL−VREF should be zero. Accordingly, when calibration amplifier 320 is perfectly calibrated, the error terminal (o) of calibration amplifier 320 should be set to VERR=0V. The auto calibration error voltage VERR is detected by calibration voltage meter 329, and a detection signal DVC indicative of the calibration error voltage VERR is provided, via signal line 323, to control circuit 330.

Still at S220, during an interval 401, control circuit 330 processes the detection signal DVC received from calibration voltage meter 329 to generate an auto calibration control signal CCS designed for calibration amplifier 320 to reduce the error that gave rise to the auto calibration error signal taking another value than zero. Control circuit 330 outputs the auto calibration control signal CCS, via control signal line 332, to control signal entrance 321 of calibration amplifier 320. For example, in accordance with the auto calibration control signal CCS, a bias voltage, also referred to as off-set voltage, of calibration amplifier 320 is reduced. In some embodiments, at S220, a plurality of adjustments to the setting of calibration amplifier 320 is thus performed during interval 401.

Based on timing information, at time t1, control circuit 330 generates a switch control signal for switch 340 to activate in-signal coupling of calibration amplifier 320, wherein the first input terminal (−) of calibration amplifier 320 is set, via reference line 362 and reference line 361, to the reference voltage VREF at reference voltage port 360, and wherein the second input terminal (+) of calibration amplifier 320, via calibration signal line 342, switch 340 and in-signal line 352, senses an in-signal voltage VSEN provided at in-signal port 350. Thus, amplifier arrangement 300 enters into an amplifier calibration mode (OP) for calibration of amplifier 310.

Now in amplifier calibration mode (OP), during an interval 402, calibration amplifier 320 sets the error terminal (o) of calibration amplifier 320 to an amplifier calibration error voltage VERR that reflects a difference between the in-signal voltage VSEN set at the second input terminal (+) of calibration amplifier 320 and the reference signal voltage VREF set at the first input terminal (−).

At the same time, that is, still at S230 and during interval 402, the first input terminal (−) of operational amplifier 310 continues to be set, via reference line 361, to the reference voltage VREF at reference voltage port 360. The second input terminal (+) of operational amplifier 310 continues to sense, via in-signal line 351, the in-signal voltage VSEN at in-signal port 350. Further, operational amplifier 310 continues to set the output terminal (o) to the amplifier out-signal voltage VAOS that reflects the difference between the in-signal voltage (for example in an embodiment where the coupling to the in-signal port is provided by a direct connection: VSEN) set at the second input terminal (+) of operational amplifier 310 and the reference signal voltage (for example in an embodiment where the coupling to reference voltage port 360 is provided by a direct connection: VREF) set at the first input terminal (−) of operational amplifier 310. Operational amplifier 310 continues to provide the amplifier out-signal voltage VAOS, via out-signal line 317, to out-signal port 370. In addition, operational amplifier 310 also provides the amplifier out-signal voltage VAOS, via node 318, to a first terminal of operational voltage meter 319.

Meanwhile, calibration amplifier 320 sets the error terminal (o) to a calibration error voltage VERR that, similar to what was described above with reference to S220, reflects the difference between the calibration signal voltage VCAL (for example in an embodiment where the coupling to in-signal port 350 via switch 340 is provided by a direct connection: VCAL=VSEN) set at the second input terminal (+) of calibration amplifier 320 and the reference signal voltage VREF set at the first input terminal (−) of calibration amplifier 320.

Calibration amplifier 320 provides the calibration error voltage VERR to a second terminal of operational voltage meter 319. Where both, the first input terminal (−) of the operational amplifier 310 and the first input terminal (−) of the calibration amplifier 320, are connected, via reference line 362, to the same reference voltage port 360, and where further both, the second input terminal (+) of the operational amplifier 310 and the second input terminal (−) of the calibration amplifier 320 are connected to the same in-signal port 350, in perfect calibration, the out-signal voltage VAOS at the output terminal (∘) of operational amplifier 310 and the calibration error voltage VERR at the output terminal (∘) of calibration amplifier 320 should be the same. Therefore, in perfect calibration, any difference of voltages VAOS−VERR should be zero. Accordingly, when operational amplifier 310 is perfectly calibrated, operational voltage meter 319 should detect zero voltage between node 318 on out-signal line 317 and node 327 on the calibration error signal line connected to the error terminal (∘) of calibration amplifier 320.

Any difference between the out-signal voltage VAOS of operational amplifier 310 and the calibration error voltage VERR of calibration amplifier 320 is detected by operational voltage meter 319, and a detection signal DVO that is indicative of the calibration voltage difference is provided, via signal line 313, to control circuit 330. Control circuit 330 processes the detection signal DVO received from operational voltage meter 319 to generate an amplifier calibration control signal ACS designed for operational amplifier 310 to reduce the error that gave rise to the difference between the out-signal voltage of operational amplifier 310 and the error voltage of calibration amplifier 320 taking another value than predetermined to be indicative of an acceptable error. Control circuit 330 outputs the amplifier calibration control signal ACS, via control signal line 331, to control signal entrance 311 of operational amplifier 310. In some embodiments, at S230, a plurality of adjustments to the setting of operational amplifier 310 is thus performed during interval 402.

In some embodiments, at S240, control circuit 330 deactivates in-signal coupling of the second input terminal (+) of calibration amplifier 320 to in-signal port 350 (not shown in FIG. 4). In some implementations, still at S240, control circuit 330 generates, based on timing information, a calibration amplifier idle signal for calibration amplifier 320 to switch into an idle mode where calibration amplifier 320 consumes less power than when operating in the auto calibration mode and/or in the amplifier calibration mode.

At S250, control circuit 330 reverts, based on timing information, to S210 and then, at S220, in some embodiments, where in-signal coupling of the second input terminal (+) of calibration amplifier 320 to in-signal port 350 is still active, deactivates in-signal coupling of the second input terminal (+) of calibration amplifier 320 to in-signal port 350. Further, at S220, again, control circuit 330 activates reference signal coupling of the second input terminal (+) of calibration amplifier 320 to reference voltage port 360. Thus, control circuit 330 reiterates a cycle of auto calibration mode (AC), amplifier calibration mode (OP), and idle mode (IDLE). However, it should be understood that, depending on structural characteristics of amplifier arrangement 300 as well as operational circumstances, in some implementations, a cycle does not need to encompass all of auto calibration mode (AC), amplifier calibration mode (OP), and idle mode (IDLE). For example, in some embodiments a first cycle 501 encompasses auto calibration mode (AC), amplifier calibration mode (OP) and idle mode (IDLE). However, assuming that calibration amplifier 320, having undergone auto calibration during the auto calibration mode (AC) of the first cycle 501, continues to be sufficiently calibrated so that there is no need for auto calibration during a second cycle 502, the second cycle 502 merely encompasses the amplifier calibration mode (OP) and the idle mode (IDLE). Eventually, at S250, if the operation is decided to be terminated, in some embodiments the method moves on to S260, where the operation of amplifier arrangement 300 ends.

Below, further embodiments, implementations and associated effects are disclosed.

This description, in an aspect according to some embodiments, describes a method for use in signal processing. The method comprises providing an operational amplifier and a reference amplifier. The method comprises coupling a control unit to the operational amplifier and to the reference amplifier. In some implementations control of the reference amplifier and the operational amplifier is performed one at a time. In some implementations control of the reference amplifier and the operational amplifier is performed alternately. In some implementations control of the operational amplifier is based on a signal that is output from the operational amplifier and/or of a signal that is output from the reference amplifier. Some embodiments of the method comprise combining a signal output from the operational amplifier and a signal output from the reference amplifier to obtain a combined signal, and using the control unit so as to control, based on the combined signal, the reference amplifier and the operational amplifier. Some embodiments comprise configuring the reference amplifier such that at least a portion ("reference portion") of a characteristic of the reference amplifier coincides with a portion of a characteristic of the operational amplifier, wherein the reference portion includes an operational point of the operational amplifier. At least one effect can be that amplification of a signal by the reference amplifier, when operated in the reference portion of the characteristic of the reference amplifier, is like amplification of a signal by the operational amplifier, when operated at the operational point of the characteristic of the operational amplifier.

Some embodiments comprise clocking a clocked control circuit so as to time switching of a reference amplifier signal input terminal at least between coupling to a reference input terminal of the operational amplifier and coupling to a sense input terminal of the operational amplifier.

This description, in an aspect according to some embodiments, describes circuitry that comprises an operational amplifier and a reference amplifier. The circuitry of some embodiments further comprises a control unit configured to control the reference amplifier based on a signal received from the reference amplifier. In some embodiments the control unit is configured to control the operational amplifier based on a signal received from the reference amplifier. The control unit is coupled to the reference amplifier and to the operational amplifier. In some embodiments an operational signal input terminal of the control unit is coupled to a signal output terminal of the operational amplifier. In some implementations an operational amplifier control output terminal of the control unit is coupled to an operational amplifier control input terminal of the operational amplifier. In some embodiments a reference signal input terminal of the control unit is coupled to a signal output terminal of the reference amplifier. In some implementations a reference amplifier control output terminal of the control unit is coupled to a control input terminal of the reference amplifier.

Some embodiments comprise a switch coupled to a signal input terminal of the reference amplifier. In some embodiments the switch is configured to switch the signal input terminal of the reference amplifier for coupling either to a reference terminal of the reference amplifier or to a sense signal terminal of the operational amplifier. In some embodiments the switch is coupled to the control unit. In some embodiments the switch is configured to receive a switch control signal from the control unit. At least one effect can be that the control unit can set the reference amplifier either to a self-calibration mode or to an operational calibration mode by setting, in the self-calibration mode, the signal input terminal of the reference amplifier to the same voltage as the reference terminal of the reference amplifier, and by setting, in the operational calibration mode, the signal input terminal of the reference amplifier to the same voltage as the sense terminal of the operational amplifier.

In some embodiments the control unit is configured to receive a reference amplifier output signal and to derive a reference control signal for use in control of the reference amplifier. In some embodiments the control unit is configured to receive an operational amplifier output signal and to derive an operational control signal for use in control of the operational amplifier. In some embodiments the control unit is configured to combine the operational amplifier output signal with the reference amplifier output signal by forming a difference voltage signal indicative of a voltage between a signal output terminal of the operational amplifier and a signal output terminal of the reference amplifier. At least one effect can be that the control signal used in control of the operational amplifier is based on a difference voltage that, provided the reference amplifier is calibrated, is indicative of lack of calibration of the operational amplifier.

Some embodiments comprise an analog-to-digital converter coupled between a signal output of the reference amplifier and a signal input of the control unit. At least one effect can be that the analog signal output from the signal output terminal of the reference amplifier can be associated with either one or the other of two states. Thus, an analog signal output from the signal output terminal of the reference amplifier can be represented by a sequence of bits. In some embodiments the analog-to-digital converter comprises an inverter. At least one effect can be that a single inverter can provide a digital signal that, at a time, represents one bit of information. Thus, the inverter can implement a one-bit analog-to-digital converter.

Some embodiments comprise a register coupled to the control unit. In some embodiments the register is configured to hold a digital representation of a signal for use in control of the operational amplifier and/or for use in control of the reference amplifier. At least one effect can be that the register can store data of a setting of the operational amplifier and/or a setting of the reference amplifier for use in initialisation of the operational amplifier and/or for use in operation of the operational amplifier.

In some embodiments the reference amplifier and the operational amplifier are configured to have the same characteristic. In some embodiments the reference amplifier and the operational amplifier are configured according to a same electrical element structural design. At least one effect can be that essentially the reference amplifier operates just as the operational amplifier. Accordingly, the reference amplifier and the operational amplifier share the same characteristic. At any point of the characteristic reference amplifier and operational amplifier operate the same. Thus, if corresponding input terminals of reference amplifier and operational amplifier are set to same voltage levels, then, to the extent that both, the reference amplifier and the operational amplifier, are calibrated, a reference output voltage signal at the output terminal of the reference amplifier and an operational output voltage signal at the output terminal of the operational amplifier are the same.

In some embodiments the control unit is provided with a clock terminal. In some embodiments the control unit is configured to use, in control of calibration of the reference amplifier, a clock signal received at the clock terminal.

In some embodiments the reference amplifier and the operational amplifier are integrated using the same layout. At least one effect can be that that both, the reference amplifier and the operational amplifier have the same characteristic and, accordingly, operate the same.

In some embodiments the control unit is provided as a programmable arithmetic logic unit. At least one effect can be that the control unit flexibly provides control functionality such that, for example, operation of the reference amplifier can be controlled so as to meet operational needs such as a priority of saving power or a priority of accuracy in operational signal amplification. Where the operational amplifier is to be implemented for co-operation with a programmable arithmetic logic unit provided for other functions, then that programmable arithmetic logic unit can be programmed to also control the operational amplifier as disclosed herein. Thus, savings in chip area can be made when compared to a case of using dedicated circuitry to control the operational amplifier. In some embodiments the control unit is provided as a state machine. At least one effect can be that the control unit provides control functional while using fewer resources such as chip surface than in a case where the control unit is provided with an arithmetic logic unit.

Some embodiments comprise at least one further reference amplifier. In some embodiments a characteristic of the at least one further reference amplifier differs from the characteristic of the operational amplifier. At least one effect can be that different reference amplifiers can be configured for operation at different operation points while being configured to use altogether less resources such as chip surface and/or power than a single reference amplifier whose structure is based on a same design as that underlying the operational amplifier. Each reference amplifier's characteristic at the reference amplifier's operation point can be similar to the characteristic of the operational amplifier at the reference amplifier's operation point such that, altogether, reference amplifiers can co-operate to provide a reference characteristic for a larger portion of the operational amplifier's characteristic than a single reference amplifier.

This description, in an aspect according to some embodiments, describes an integrated circuit chip comprising an operational amplifier and a reference amplifier. The integrated circuit chip further comprises a control unit. In some embodiments the control unit is coupled to the reference amplifier and to the operational amplifier. The control unit is configured to control the operational amplifier based on a combination of a signal received from the reference amplifier and a signal received from the operational amplifier. In some embodiments the control unit is configured to control the reference amplifier based on the signal received from the reference amplifier. In some embodiments a signal input terminal of the control unit is coupled to a signal output terminal of the operational amplifier. In some embodiments a control output terminal of the control unit is coupled to a control input terminal of the reference amplifier.

Some embodiments comprise a switch coupled to a signal input terminal of the reference amplifier. In some embodiments the switch is configured to switch a signal input terminal of the reference amplifier for coupling either to a reference terminal of the reference amplifier or to a sense signal terminal of the operational amplifier. In some embodiments the switch is coupled to the control unit. In some embodiments the switch is configured to receive a switch control signal from the control unit.

In some embodiments the control unit is configured to receive a reference amplifier output signal to derive a reference control signal for use in control of the reference amplifier. In some embodiments the control unit is configured to receive an operational amplifier output signal to derive an operational control signal for use in control of the operational amplifier. In some embodiments the operational amplifier output signal is combined with the reference amplifier output signal so as to form a combined signal. In some implementations the combining is forming a voltage difference signal indicative or representative of a voltage difference, in some examples, between the voltage at the output terminal of the operational amplifier and the voltage at the output of the reference amplifier.

Some embodiments comprise an analog-to-digital converter coupled between a signal output of the reference amplifier and a signal input of the control unit. In some embodiments the analog-to-digital converter comprises an inverter. At least one effect can be that a single inverter can provide digital signals that represent, at one time, one bit of information. Thus, the inverter forms a one-bit analog-to-digital converter. Some embodiments comprise more than one inverter to form a multi-bit analog-to-digital converter.

Some embodiments comprise at least one register coupled to the control unit. In some embodiments the register is configured to hold a digital representation of a signal for use in control of the operational amplifier and/or for use in control of the reference amplifier. At least one effect can be that a digital representation of control information to set the operational amplifier to a calibrated state can be stored in the register as operational amplifier calibration data. Likewise, a digital representation of control information to set the reference amplifier to a calibrated state can be stored in the register as reference amplifier calibration data. In some implementations the control unit is configured to read, for example when ramping the integrated circuit chip or when powering a circuit portion of the integrated circuit chip that comprises the operational amplifier, the calibration data from the memory so as to use the reference calibration data at least in control of the reference amplifier, for example, initially upon powering, and/or to use the operational calibration data at least in control of the operational amplifier, for example, initially upon powering.

In some embodiments the reference amplifier and the operational amplifier are configured to have the same characteristic. In some embodiments the reference amplifier and the operational amplifier are configured according to a same electrical element structural design.

In some embodiments the control unit is provided with a clock terminal. In some embodiments the control unit is configured to use a clock signal in control of calibration of the at least one reference amplifier. In some embodiments the control unit is configured to alternately use the clock signal in control of calibration of the operational amplifier.

In some embodiments the control unit is provided as a programmable arithmetic logic unit. In some embodiments the control unit is provided as a state machine. Some embodiments comprise at least one further reference amplifier. In some embodiments a characteristic of the at least one further reference amplifier differs from the characteristic of the operational amplifier.

Some or all method steps described herein may be executed by (or using) a hardware apparatus, like for example, a microprocessor, a programmable computer or an electronic circuit. Some embodiments include a processing means, for example a computer, or a programmable logic device, configured to or adapted to perform one of the methods described herein. In some embodiments a programmable logic device (for example a field programmable gate array) may be used to perform some or all of the functionalities of the methods described herein. In general, any apparatus capable of implementing a state machine that is in turn capable of implementing the methodology described and illustrated herein may be used to implement the various methods, protocols and techniques according to the implementations. In some embodiments, a field programmable gate array may cooperate with a microprocessor in order to perform one of the methods described herein. Generally, the methods can be performed by any hardware apparatus. Some embodiments include a data carrier having electronically readable control signals, which are capable of cooperating with a programmable computer system, such that one of the methods described herein is performed. Arrangements, procedures and protocols of the described implementations may be implemented on a special purpose computer, a programmed microprocessor or micro-controller and peripheral integrated circuit element(s), an ASIC or other integrated circuit, a digital signal processor, a flashable device, a hard-wired electronic or logic circuit such as discrete element circuit, a programmable logic device such as PLD, PLA, FPGA, PAL, a modem, a transmitter/receiver, any comparable device, or the like. The disclosed arrangements may be implemented partially or fully in hardware using logic circuits or VLSI design.

In some instances, well-known features are omitted or simplified to clarify the description of the exemplary implementations. The implementations herein are described in terms of exemplary embodiments. However, it should be appreciated that individual aspects of the implementations may be separately claimed and one or more of the features of the various embodiments may be combined. Although some aspects have been described in the context of an apparatus, these aspects also represent a description of the corresponding method, where a block or device corresponds to a method step or a feature of a method step. Analogously, aspects described in the context of a method step also represent a description of a corresponding block or item or feature of a corresponding apparatus. Exemplary implementations/embodiments discussed herein may have various components collocated; however, it should be appreciated that the components of the arrangements may be combined into one or more apparatuses.

As used herein, the articles 'a' and 'an' should generally be construed to mean 'one or more,' unless specified otherwise or clear from context to be directed to a singular form.

As used herein, the terms 'having', 'containing', 'including', 'with' or variants thereof, and like terms are open ended terms intended to be inclusive. These terms indicate the presence of stated elements or features, but do not preclude additional elements or features.

As used herein, the word 'exemplary' means serving as an example, instance, or illustration. Any aspect or design described herein as 'exemplary' is not necessarily to be construed as preferred or advantageous over other aspects or designs. Rather, use of the word exemplary is intended to present concepts and techniques in a concrete fashion. The term 'techniques,' for instance, may refer to one or more devices, apparatuses, systems, methods, articles of manufacture, and/or computer-readable instructions as indicated by the context described herein.

As used herein, terms such as 'first', 'second', and the like, are also used to describe various elements, regions, sections, etc. and are also not intended to be limiting.

As used herein, the wording 'amplification of a signal' encompasses meaning such as a typical meaning of increasing a signal amplitude, but also, as the case may be in a particular implementation, decreasing the signal amplitude or keeping the signal amplitude the same.

As used herein, the terms 'coupled' and 'connected' may have been used to describe how various elements interface. Unless expressly stated or at least implied otherwise, such described interfacing of various elements may be either direct or indirect.

As used herein, the wording 'A coupled to B' means a capacity of A to provide C to B, provided that B is ready to accept C, wherein C, as the case may be, is a signal, power, message or other abstract or concrete thing as described in the context of the wording.

As used herein, the word 'terminal' denotes a conductor line or other circuit element or circuitry configured to link coupled components.

The invention claimed is:

1. A method for use in signal processing, comprising:
providing an operational amplifier;
providing a reference amplifier;
coupling a controller to the operational amplifier and to the reference amplifier;
combining a signal output from the operational amplifier and a signal output from the reference amplifier to obtain a combined signal;
using the controller so as to control, based on the combined signal, the reference amplifier and the operational amplifier; and
clocking the controller so as to time switching of a reference amplifier input terminal at least between coupling to a reference input terminal of the operational amplifier and coupling to a sense input terminal of the operational amplifier.

2. The method for use in signal processing of claim 1, comprising
clocking the controller so as to time switching of a reference amplifier input terminal at least between coupling to a reference input terminal of the operational amplifier and coupling to a sense input terminal of the operational amplifier.

3. Circuitry for use in signal processing, comprising:
an operational amplifier;
a reference amplifier;
a controller configured to control the operational amplifier based on a combination of a signal received from the operational amplifier and a signal received from the reference amplifier; and
a switch coupled to a signal input terminal of the reference amplifier, wherein the switch is configured to switch the signal input terminal of the reference amplifier for coupling either to a reference terminal of the reference amplifier or to a sense signal terminal of the operational amplifier.

4. The circuitry of claim 3,
wherein the switch is coupled to the controller, and
wherein the switch is configured to receive a switch control signal from the controller.

5. The circuitry of claim 3,
wherein the controller is configured to receive a reference amplifier output signal to derive a reference control signal for use in control of the reference amplifier.

6. The circuitry of claim 5,
wherein the controller is configured to receive an operational amplifier output signal to derive an operational control signal for use in control of the operational amplifier.

7. The circuitry of claim 6,
wherein the controller is configured to combine the operational amplifier output signal with the reference amplifier output signal by forming a difference voltage signal indicative of a voltage between a signal output terminal of the operational amplifier and a signal output terminal of the reference amplifier.

8. The circuitry of claim 3,
comprising an analog-to-digital converter coupled between a signal output of the reference amplifier and a signal input of the controller.

9. The circuitry of claim 8, wherein the analog-to-digital converter comprises an inverter.

10. The circuitry of claim 3,
comprising a register coupled to the controller,
wherein the register is configured to hold a digital representation of a signal for use in control of the operational amplifier and/or for use in control of the reference amplifier.

11. The circuitry of claim 3, wherein the controller is provided with a clock terminal, wherein the controller is configured to use, in control of calibration of the reference amplifier, a clock signal received at the clock terminal.

12. The circuitry of claim 3,
wherein the controller is provided as a state machine.

13. The circuitry of claim 3,
comprising at least one further reference amplifier,
wherein a characteristic of the at least one further reference amplifier differs from the characteristic of the operational amplifier.

14. An integrated circuit chip for use in signal processing, comprising:
an operational amplifier;
a reference amplifier; and
a controller configured to be coupled to the reference amplifier and to the operational amplifier,
wherein the controller is configured to control the operational amplifier based on a combination of a signal received from the reference amplifier and a signal received from the operational amplifier, and
wherein the controller comprises a clock terminal, is configured to use a clock signal in controlling calibration of the reference amplifier, and is configured to alternatively use the clock signal in controlling calibration of the operational amplifier.

15. The integrated circuit chip of claim 14,
comprising a switch coupled to a signal input terminal of the reference amplifier,
wherein the switch is configured to switch a signal input terminal of the reference amplifier for coupling either to a reference terminal of the reference amplifier or to a sense signal terminal of the operational amplifier.

16. The integrated circuit chip of claim 14, wherein the controller is configured to receive the reference amplifier output signal and to derive a reference control signal for use in control of the reference amplifier.

17. The integrated circuit chip of claim 14, comprising an analog-to-digital converter coupled between a signal output of the reference amplifier and a signal input of the controller.

18. The integrated circuit chip of claim 14, comprising a register coupled to the controller, wherein the register is configured to hold a digital representation of a signal for use in control of the operational amplifier and/or for use in control of the reference amplifier.

* * * * *